United States Patent
Luzzi

(10) Patent No.: US 9,059,581 B2
(45) Date of Patent: Jun. 16, 2015

(54) COLD SHRINKABLE PRIMARY JOINT

(75) Inventor: Glenn J. Luzzi, Mt. Bethel, PA (US)

(73) Assignee: Richards Manufacturing Company, a New Jersey Limited Partnership, Irvington, NJ (US)

( * ) Notice: Subject to any disclaimer, the term of this patent is extended or adjusted under 35 U.S.C. 154(b) by 128 days.

(21) Appl. No.: 13/447,784

(22) Filed: Apr. 16, 2012

(65) Prior Publication Data

US 2012/0273246 A1    Nov. 1, 2012

Related U.S. Application Data

(60) Provisional application No. 61/480,224, filed on Apr. 28, 2011.

(51) Int. Cl.
*H01R 4/00* (2006.01)
*H02G 15/18* (2006.01)
*H02G 15/184* (2006.01)

(52) U.S. Cl.
CPC ......... *H02G 15/1833* (2013.01); *H02G 15/184* (2013.01)

(58) Field of Classification Search
USPC ................................. 174/88 R, 91, 93, 84 R
See application file for complete search history.

(56) References Cited

U.S. PATENT DOCUMENTS

| | | | | |
|---|---|---|---|---|
| 3,692,922 A * | 9/1972 | Sugimoto et al. | ............ | 174/73.1 |
| 3,717,717 A * | 2/1973 | Cunningham et al. | ....... | 174/73.1 |
| 3,896,260 A * | 7/1975 | Plummer | ........................ | 174/92 |
| 3,980,374 A * | 9/1976 | Fallot | ............................... | 439/89 |
| 4,499,129 A * | 2/1985 | Kridl et al. | .................... | 428/34.9 |
| 4,501,927 A * | 2/1985 | Sievert | ............................. | 174/93 |
| 4,520,229 A * | 5/1985 | Luzzi et al. | .................. | 174/73.1 |
| 4,581,265 A * | 4/1986 | Follette | ......................... | 428/36.1 |
| 4,849,580 A * | 7/1989 | Reuter | ............................ | 174/92 |
| 5,230,640 A | 7/1993 | Tardif | | |
| 6,245,999 B1 * | 6/2001 | Costigan et al. | ............ | 174/74 A |
| 6,884,124 B1 | 4/2005 | Luzzi | | |
| 6,991,484 B2 | 1/2006 | Luzzi | | |
| 7,381,103 B2 | 6/2008 | Luzzi | | |
| 7,431,599 B2 | 10/2008 | Luzzi | | |
| 7,517,260 B2 | 4/2009 | Luzzi | | |
| 7,588,469 B2 | 9/2009 | Luzzi | | |
| 7,985,093 B2 | 7/2011 | Luzzi et al. | | |
| 8,070,509 B2 | 12/2011 | Luzzi | | |
| 8,187,025 B2 | 5/2012 | Luzzi | | |
| 8,221,155 B2 | 7/2012 | Luzzi | | |
| 8,502,076 B2 | 8/2013 | Luzzi | | |
| 2003/0079902 A1 * | 5/2003 | Luzzi | ......................... | 174/88 R |
| 2006/0272842 A1 * | 12/2006 | Vallauri et al. | ............... | 174/73.1 |
| 2008/0135288 A1 * | 6/2008 | Taylor et al. | ................ | 174/74 A |
| 2009/0230090 A1 | 9/2009 | Luzzi | | |
| 2009/0298342 A1 | 12/2009 | Luzzi | | |

(Continued)

*Primary Examiner* — Timothy Thompson
*Assistant Examiner* — Sherman Ng
(74) *Attorney, Agent, or Firm* — Stroock & Stroock & Lavan LLP

(57) ABSTRACT

A splice housing is configured to slide over and engage with a metallic connector that couples together cable conductors in an electrical distribution system. The splice housing has a first end arranged to engage a first cable, a second end arranged to engage a second cable and a central portion set between the first and second ends that engages the metallic connector. A first support core holds the first end in an expanded state, while a second support core holds the second end in an expanded state. The first and the second ends are molded so that they have relaxed internal diameters that are smaller than a relaxed internal diameter of the central portion.

45 Claims, 15 Drawing Sheets

(56) References Cited

U.S. PATENT DOCUMENTS

2010/0116638 A1   5/2010   Luzzi
2010/0193235 A1*  8/2010   Taylor et al. .................. 174/363
2010/0200292 A1   8/2010   Luzzi
2012/0273246 A1  11/2012   Luzzi

* cited by examiner

COLD SHRINKABLE PRIMARY JOINT

CROSS-REFERENCE TO RELATED APPLICATIONS

This application claims the benefit of U.S. Provisional Application No. 61/480,224, filed Apr. 28, 2011, the contents of which are incorporated herein by reference.

BACKGROUND OF THE INVENTION

1. Field of the Invention

The present invention generally relates to electrical power distribution systems. In particular, the present invention relates to splices used in such distribution systems.

2. Description of the Related Art

In a typical electrical power distribution system, there exist various methods and systems for joining power distribution cables. For example, two cable conductors may be joined or spliced together by using a metallic connector that joins the two cable conductors together, and a splice housing that covers and encloses the metallic connector. The splice housing is typically composed of: (i) an internal Faraday shield around the metallic connector and any internal air spaces; (ii) insulation surrounding the internal Faraday shield, the insulation being of suitable material and thickness for typical voltage class systems of 5, 15, 25 or 35 kV; and (iii) an external semi-conductive shield. Additional metallic components can be used during splicing to restore the cable metallic shielding, and end seals can be provided to prevent water migration under the cable jacket.

Many of the current splicing systems contain the above components as either several different components or as a unified single splice housing unit and the metallic connector. An example of a drawback of having more components is the increase in installation errors and decrease in reliability. Typically, the metallic connect is standardized but there may be multiple types of splice housings.

An example of a splice housing is a tape splice housing where, after two cables are joined with the metallic connector, the splice housing is constructed by hand-taping sequential layers of both conductive and insulating tapes. An example of a drawback to the tape splice housing is the long length of time it takes to construct the splice housing and the high skill requirement of the splicer constructing the splice housing.

Another example of a splice housing is an interference fit push on. The push-on housing is initially stored onto one of two cables prior to connecting the two cables. After the metallic connector is installed, the push-on housing is pushed and installed over the metallic connector and cable ends. Drawbacks include the installation force necessary to store and position the housing and the need for many different size housings to cover different cable sizes, as well as the difficulty of incorporating end seals.

Another example of a splice housing is a heat shrinkable splice housing. The heat shrinkable housing is initially stored onto one of two cables prior to connecting the two cables. After the metallic connector is installed, the heat shrinkable splice housing is slid over the connector and cable ends. The heat shrinkable splice housing is then reduced in size by applying heat, until the heat shrinkable housing shrinks completely in place. An example of a drawback to the heat shrinkable splice housing is the necessity of using a torch or other heat-applying device, which can be dangerous, particularly within the enclosed spaces of manholes and the like where electrical distribution cables are typically found. Another drawback is that the application of heat requires a technician with a high level of skill in order to ensure that the heat shrinkable tubes of the housing are uniformly formed and adequately shrunk. A further drawback is that the technician also ensures that sufficient heat is used to activate the heat shrinkable housing tubes and sealing materials, yet that not too much heat is applied that would otherwise damage any materials or the cable insulation.

Another example of a splice housing is a cold shrinkable splice housing. The cold shrinkable housing is initially stored onto one of two cables prior to connecting the two cables. After the connector is installed, the cold shrinkable housing is slid back over the connector and cable ends. A support core is removed from one end (or removed from each end in the case of a two-piece support core) allowing the insulating housing to constrict over the connector and cable ends. The support tube(s) of the cold shrinkable housing can be a solid-type core, a spiral core or a friable core. The cold shrinkable housing can also be sealed with a seal material in order to provide the proper environmental sealing. Sealing materials are typically composed of a mastic of putty consistency, for example a butyl. The sealing material is usually applied to the cable insulation ends prior to pulling the expanded tube into position, although the preferred method, as a result of foreseeable workmanship mistakes, would be to have the sealant pre-installed under the removable core. However, maintaining the position of the core during removal is problematic.

An example of a drawback to the cold shrinkable housing is that as the insulating tube increases in length so too must the support core, which may cause problems. For example, the removal of a long core is time-consuming and creates ergonomic issues. Furthermore, the support cores are typically rigid along their entire length, requiring large storage facilities to allow the cores to be stored perfectly straight. When a spiral core is used, the spiral core must be unwound when removed in order to prevent jamming. A drawback to this is that it is difficult to keep the sealing mastic in place if included under the pre-stretched unit. Furthermore, spiral cores require the shrinkable tube to be expanded more than is required of a solid core to allow easy removal of the core. In the case of designs using a central, non-removable support core and only short spiral cores on the ends, there must be a method of removing or wicking heat off of the connector since an air space is left between the non-removed support core and the connector. Also, when a solid core is used, the solid support core requires an auxiliary film between the shrinkable tube and the support core to aid in easy removal. The length of these support cores depends on whether it is a single unit removed from one end or two separate cores removed from each end.

Other major drawbacks of the current heat and cold shrinkable splice housing designs include the need for the housing conductive materials and insulating materials to be identical throughout the length of the tube or tubes. However, since the conductive and insulating materials serve different purposes, this requirement leads to comprises in the required properties of the materials. Furthermore, for the current heat and cold shrinkable splice housing designs, there is presently no technique for incorporating a test point for testing the transmission circuit of the cable system for an energized condition. This is dangerous because the determination of whether or not the cables are energized can lead to a determination as to whether or not the circuit may electrocute a user.

In light of the shortcomings of the conventional methods and applications known in the art, it is desirable to provide a splice housing that allows for smaller core centers, flexibility in the material parameters, and insertion of testing points to determine whether the cable circuit is energized.

SUMMARY OF THE INVENTION

In one aspect, a splice housing according to an embodiment of the invention includes a first end constructed and arranged to engage a first cable, a second end constructed and arranged to engage a second cable, and a central portion disposed between the first and second ends and constructed to engage a metallic connector that mechanically couples the first cable to the second cable. First and second support cores hold the first and second ends in an expanded state. The first end and the second end are formed to have relaxed internal diameters that are smaller than a relaxed internal diameter of the central portion. Preferably, the internal diameter of the central portion is defined by an insert, in which the insert is configured to mechanically and thermally engage with the metallic connector. An insulating material is disposed between the insert and an exterior of the central portion. An advantage of this configuration is that exteriors of the first and second ends can be formed from materials that are different from the material used to form the exterior of the central portion.

In some embodiments a test point structure is provided, which is disposed in the central portion and used to test an electrical state of first or second cables, or of the splice itself. In preferred embodiments the test point structure includes a test point disposed within the insulating material and extending out of the exterior of the central portion.

In a preferred embodiment splice housing, ends of the insert extend partially into the first end and the second end, while the first support core and the second support core do not extend into the central portion.

The splice housing may be formed so that the first end and the second end each comprise a seal flap folded back upon itself. Also, a release material may be disposed between each support core and the first and second ends.

In another aspect, a method for attaching a first cable to a second cable is disclosed. A connector is used to mechanically and electrically couple the first cable to the second cable. A splice housing is slid over the connector so that an insert within a central portion of the splice housing contacts the connector. A first support core is removed from a first end of the splice housing so that the first end of the splice housing constricts onto the first cable, and similarly a second support core is removed from a second end of the splice housing so that the second end of the splice housing constricts onto the second cable.

In some variations, a sealing material may be applied to the first cable and to the second cable. A first seal flap folded over on the first end of the splice housing is unfolded onto the first cable, so that the first seal flap engages with the sealing material. Similarly, a second seal flap folded over onto the second end of the splice housing is unfolded onto the second cable, so that the second seal flap engages with the sealing material. The method may further include utilizing a test point structure in the central portion of the splice housing to test an electrical state of the first cable, the second cable or a splice between the first and second cables.

BRIEF DESCRIPTION OF THE DRAWINGS

The various aspects and embodiments disclosed herein will be better understood when read in conjunction with the appended drawings, wherein like reference numerals refer to like components. For the purposes of illustrating aspects of the present application, there are shown in the drawings certain preferred embodiments. It should be understood, however, that the application is not limited to the precise arrangement, structures, features, embodiments, aspects, and devices shown, and the arrangements, structures, features, embodiments, aspects and devices shown may be used singularly or in combination with other arrangements, structures, features, embodiments, aspects and devices. The drawings are not necessarily drawn to scale and are not in any way intended to limit the scope of this invention, but are merely presented to clarify illustrated embodiments of the invention. In these drawings.

DETAILED DESCRIPTION OF THE PREFERRED EMBODIMENTS

Figure 1A:
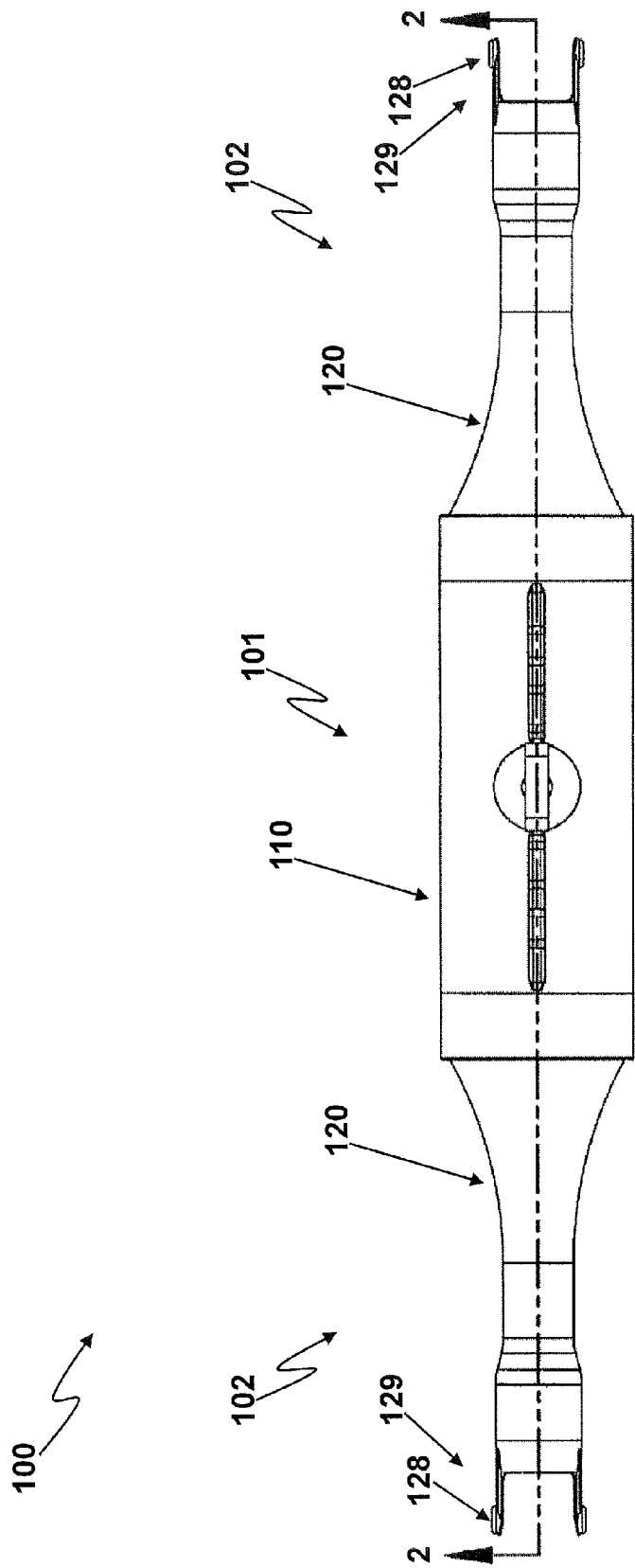
FIG. 1A is a top view of a splice housing as molded according to an embodiment of the invention.
Figure 1B:
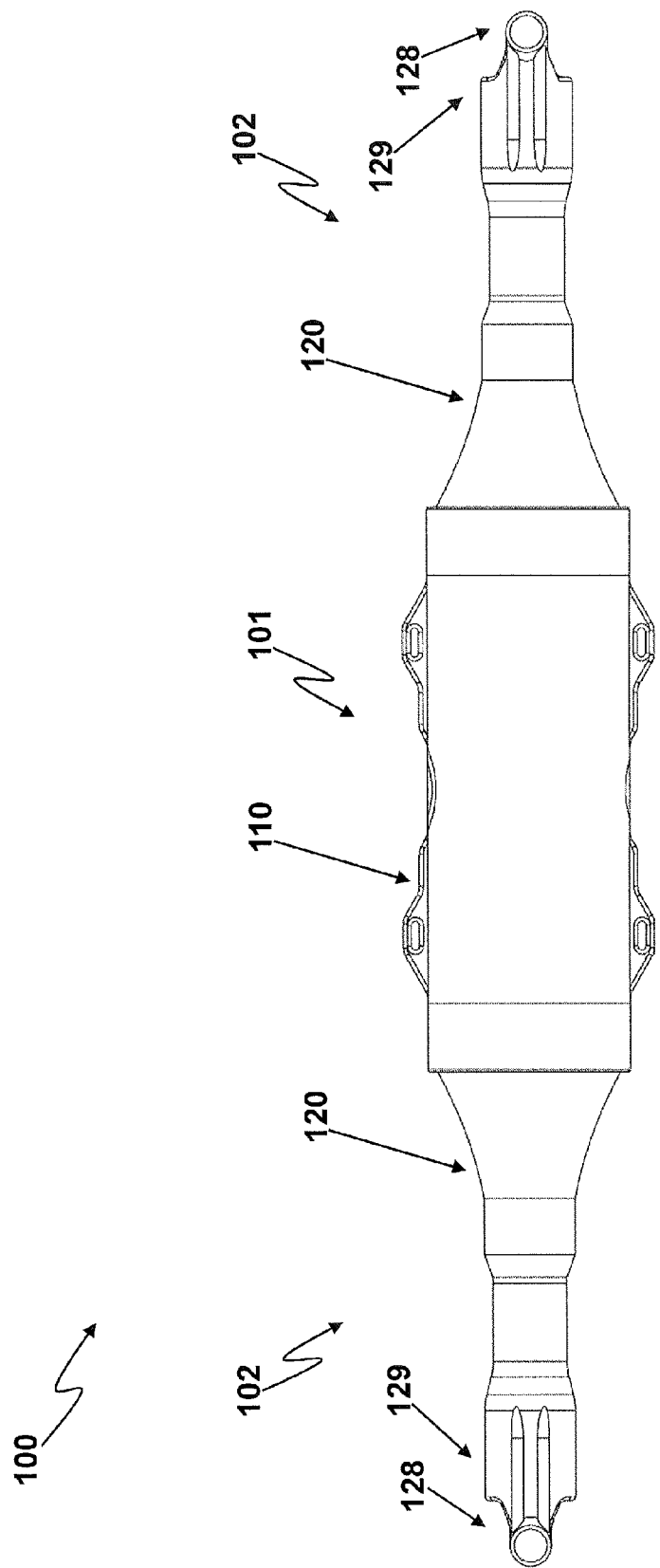
FIG. 1B is a side view of a splice housing as molded according to an embodiment of the invention.

As illustrated generally in the figures, an embodiment splice housing 100 presents as a single unit that may be fit over a metallic crimp connector 50 used to splice together cable conductors 10, 20. The splice housing 100 includes an electrically conductive rubber exterior 110, 120, an electrically and thermally conductive insert 140 that serves as a Faraday cage, and an insulating material 150 disposed between the electrically and thermally conductive insert 140 and the electrically conductive rubber exterior 110, 120.

The splice housing 100 is formed from three components: a center section 101 and two end sections 102, each of which is connected to a respective end of the center section 101. Conductive rubber exterior 110 covers the exterior of center section 101, while a respective conductive rubber exterior 120 covers each of the end sections 102. The conductive rubber exteriors 120 are physically and directly coupled to the conductive rubber exterior 110 by way of joints 119. By way of example, in some embodiments the joints 119 are formed by molding a reduced diameter on each end of the conductive rubber exterior 110. The corresponding ends of each conductive rubber exterior 120 are molded with a recess to accommodate the reduced diameters of on the ends of conductive rubber exterior 110.

The joints 119 are preferably positioned within the center section 101. That is, the rubber exteriors 120 of the end sections 102 preferably extend into the center section 101 to join with the rubber exterior 110. At their opposite ends, the rubber exteriors 120 are shaped to form seal flaps 129. The seal flaps 129 may be shaped to have a diameter that exceeds the narrow-most diameter 121 of the end sections 102 when the splice 100 is in its relaxed or molded configuration. For the following, a "relaxed" configuration is a configuration a component tends to return to when not forcibly expanded.

Figure 8:
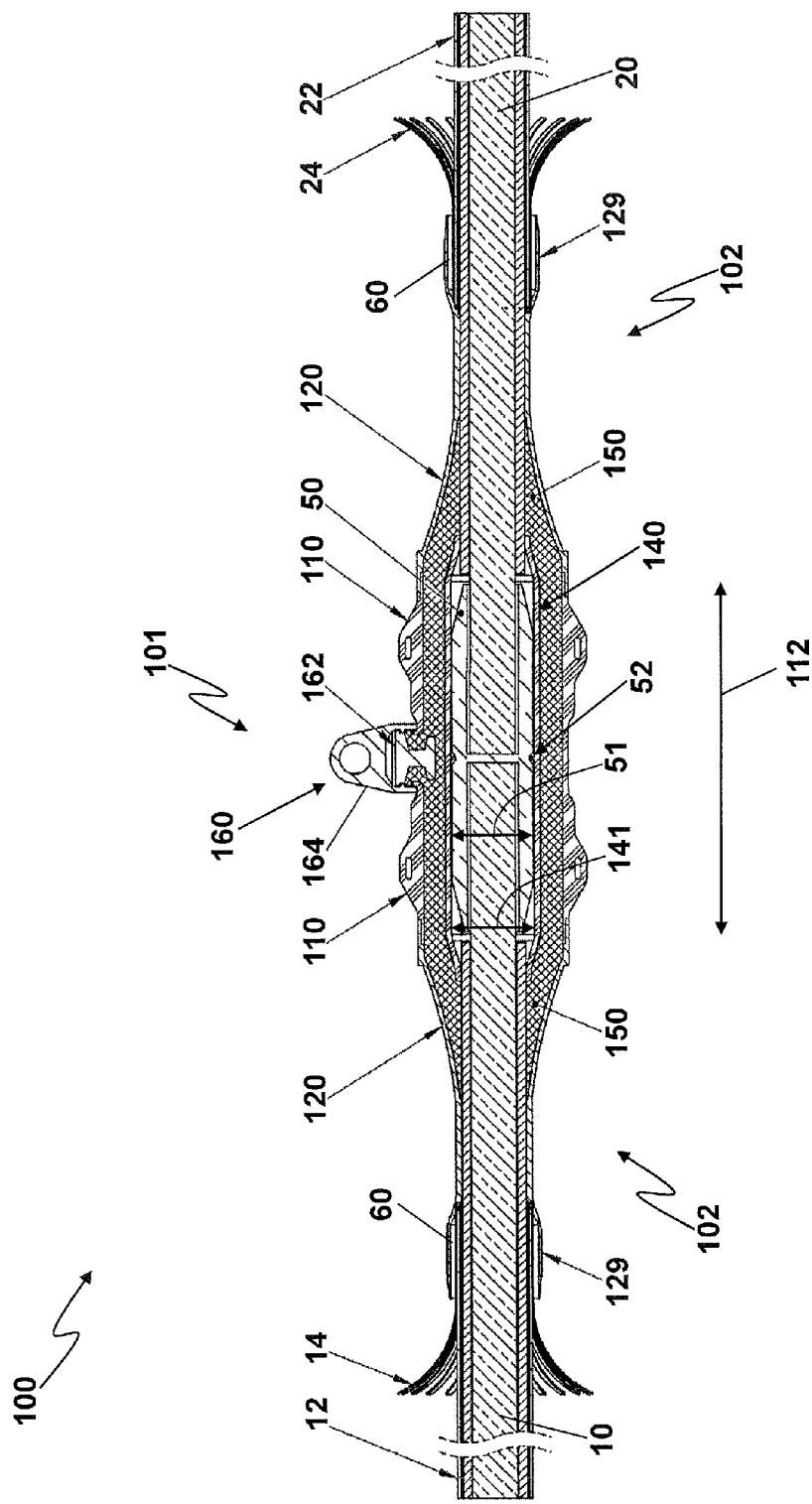
FIG. 8 is a cross-sectional view along a line 8-8 shown in FIG. 7.

The seal flaps 129 are preferably designed to form a seal over cable shield wires 14, 24 (indicated in FIG. 8). The diameter of cable conductors 10, 20 at the area of the seal may be considered to be equal to the largest diameter of the cable 10, 20, plus two times the additional thickness of the shield wires 14, 24, the sealing mastic (if present) under the shield wires 14, 24 and the additional sealing mastic placed over the shield wires 14, 24. In various embodiments, the resulting diameter may be approximately ¾" larger than the corresponding diameter over the insulation of cable conductors 10, 20. Thus, in preferred embodiments, the seal flaps 129 are configured to be approximately ¾" larger in diameter over the inside diameter of the splice interfaces. When stored, these seal flaps 129 may be folded over themselves. In various embodiments the diameters of the seal flaps 129 may be from 100% to 200% larger than the narrow-most diameter 121; in preferred embodiments the diameters of the seal flaps 129 are about 150% larger than the narrow-most diameter 121.

As described in more detail below, the center section 101 does not undergo the substantial physical expansion required of the support cores 130 and thus the materials used therein need not be as resilient as the materials used for the end sections 102. Specifically, the center section 101 conductive rubber exterior 110 can be made from a material that is different from that used to form the rubber exteriors 120. In particular, the center section 101 rubber exterior 110 may be selected for electrical characteristics over elasticity characteristics. Such materials may include elastomeric materials capable of being made sufficiently electrically conductive to serve as a Faraday cage (i.e, a conductor shield) and still have elastic properties. Non-limiting examples of such materials include ethylene propylene rubber (EPR), ethylene propylene diene monomer rubber (EPDM), styrene-butadiene rubber (SBR), natural rubber, nitrile butadiene rubber (NBR), polychloroprene and chlorosulfonated polyethylene. In a preferred embodiment, rubber exterior 110 is made from EPDM.

On the other hand, as the end sections 102 may undergo significant expansion and contraction by way of insertion and subsequent removal of the support cores 130, the materials used for the rubber exteriors 120 may be selected with preference to elastic properties over electrical properties. Such materials may include EPR, EPDM, SBR, natural rubber, NBR, polychloroprene and chlorosulfonated polyethylene. In a preferred embodiment, rubber exteriors 120 are made from EPDM. However, increased elasticity (such as elongation) and resilience (such as having a low tension set) may be derived from the choice of the base polymer used, filler materials, processing aids and the curing system employed.

In a preferred embodiment, the center section 101 is defined by an internal diameter 141 that is substantially constant along its longitudinal length 112 and that is provided at least in part by the internal diameter 141 of the insert 140. The insert 140 is preferably made from fine particle carbon filled EPDM molded into a tubular shape with specific radii at the ends of the tube and is bonded to the insulating material 150. In particular, the radii may be determined by the allowable electrical stress at the ends of the insert for the specific voltage class rating of the joint 100. The center section 101 is formed so that the internal diameter 141 is equal to, or more preferably, slightly less than the external diameter 51 of the metallic connector 50. For example, the internal diameter 141 may be from 0% to 10%, more preferably still 5% to 10%, yet more preferably still about 8% smaller than the external diameter 51 of the metallic connector 50. The internal diameter 141 is selected so that a snug interference fit is generated between the insert 140 and the metallic connector 50. This fit should be tight enough to ensure both good electrical and thermal contact between the insert 140 and the connector 50, yet not so tight that a lineman cannot slide the splice 100 over the connector 50 without the aid of tools. In preferred embodiments the insert 140 extends across the entire longitudinal length 112 of the center section 101 and may extend into a portion of the end sections 102. Insert 140 is preferably the length of connector 50 plus an additional length on each end of insert 140 to extend over the end of the cable insulation 16, 26 (shown in FIG. 6). The additional length may further include errors in cutting the ends of the cables 10, 20, plus an additional amount to allow a respective space between the ends of connector 50 and the beginning of the cable insulation, which may vary with splicer errors.

Insulating material 150 is disposed around the insert 140, and between the insert 140 and the rubber exteriors 110, 120. Insulating material 150 is preferably selected for good electrical insulating properties and good permanent set properties and is used to electrically insulate the insert 140 from the rubber exteriors 110, 120. Preferred materials for insulating material 150 include EPDM and silicone. EPDM (or silicone) may, for example, be used as a base polymer in the joint 100. By way of example, by adding conductive carbon black to the formulation, the conductivity of the resulting part will become conductive based on the amount of carbon black added; in this manner, both insulative and conductive materials may be obtained from the same base polymer. Regardless of the actual material used, insulating material 150 preferably has a thickness suitable for the desired voltage class. For example, for a 15 kV class device the thickness may be from 0.150 to 0.500 inches; for a 25 kV class device the thickness may be from 0.250" to 0.500"; for a 35 kV class device the thickness may be 0.300" to 0.500". Or, a 35 kV class device could be used, for example, for a 15 kV or a 25 kV device. In preferred embodiments, the insulating material 150 also extends beyond the ends of the insert 140, and thus at least partially into the end sections 102. The insulating material 150 preferably smoothly tapers within the end sections 102 as a function of distance from the center section 101, and so does not extend to the seal flaps 129, and even more preferably does not extend to the region of minimum diameter 121 of the end sections 102.

Figure 2:
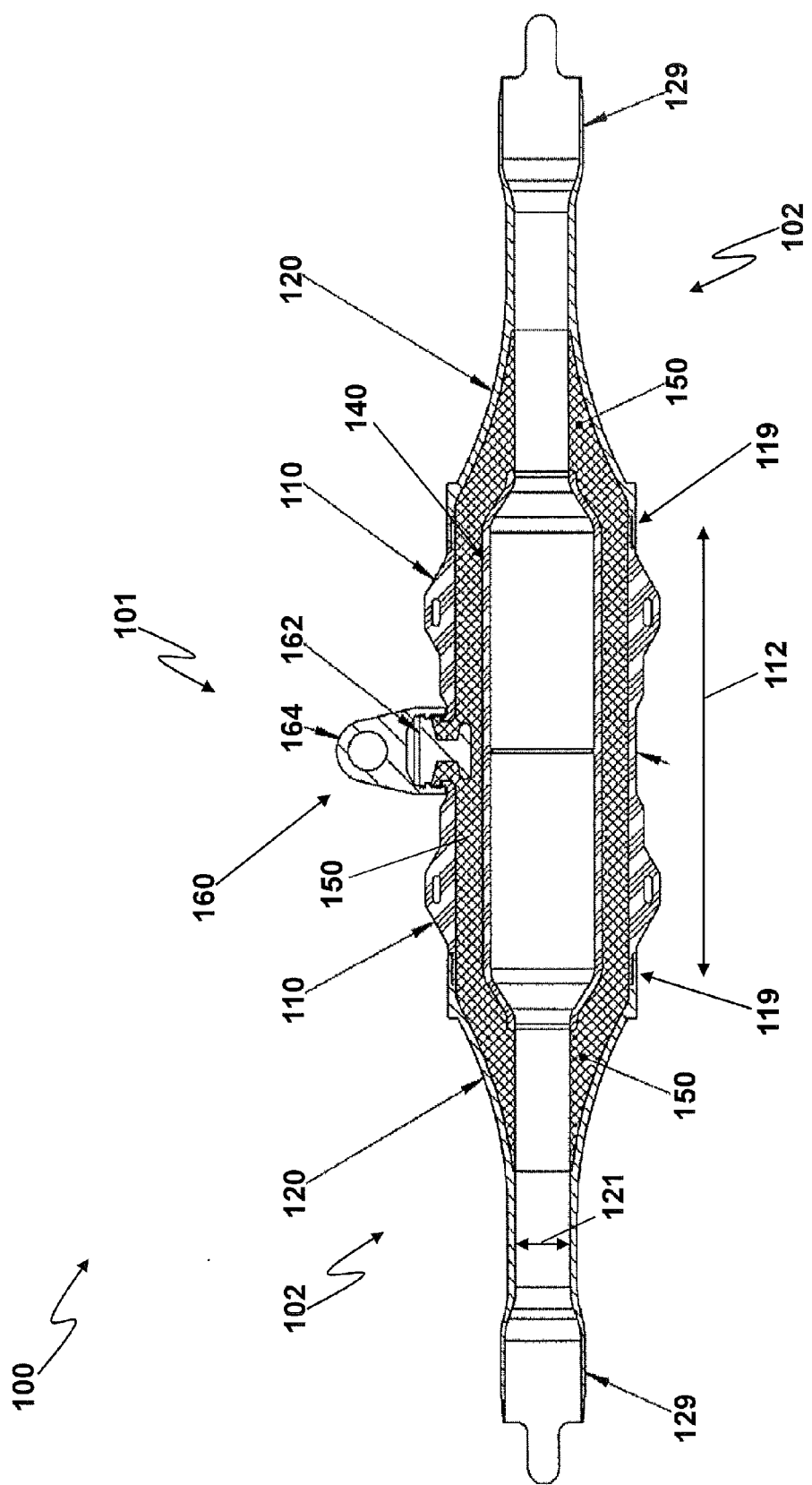
FIG. 2 is a cross-sectional view along a line 2-2 shown in FIG. 1A.

As shown in FIGS. 1A and 2, the embodiment splice housing 100 is initially molded so that its end sections 102 are smaller in diameter than the middle section 101 when in a relaxed configuration. That is, in its natural, relaxed state, the end sections 102 are formed to have a region of minimum internal diameter 121 that is smaller than the internal diameter 141 of the center section 101. Specifically, the exteriors 120 are formed so that their portions of the joints 119 have an external diameter that is substantially equal to the external diameter of the of the center rubber exterior 110. The end exteriors 120 are then formed to taper in diameter along a distal direction (i.e., towards the seal flaps 129), reaching a region of relatively constant minimum diameter 121. The exteriors 120 then flare slightly to form the seal flaps 129. The end design may be configured to make it easy for the lineman to pull the flaps 129 up and over the seal area. For example, the ends may have tabs 128 that can be pulled upon, which may also assist in guiding the flap 129 over the seal.

Figure 3A:
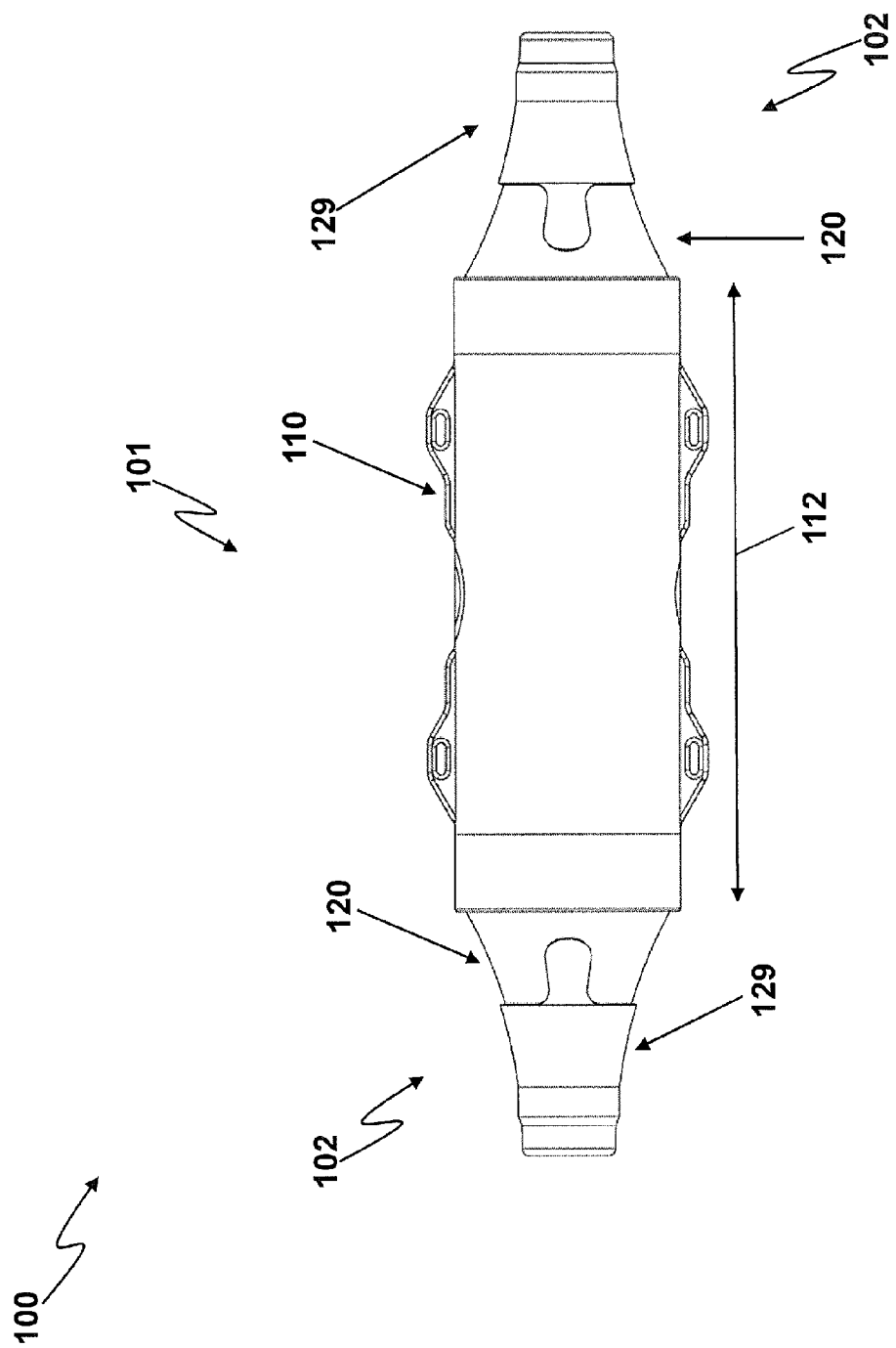
FIG. 3A is a side view of a completed splice housing in an unexpanded state without support cores according to an embodiment of the invention.
Figure 3B:
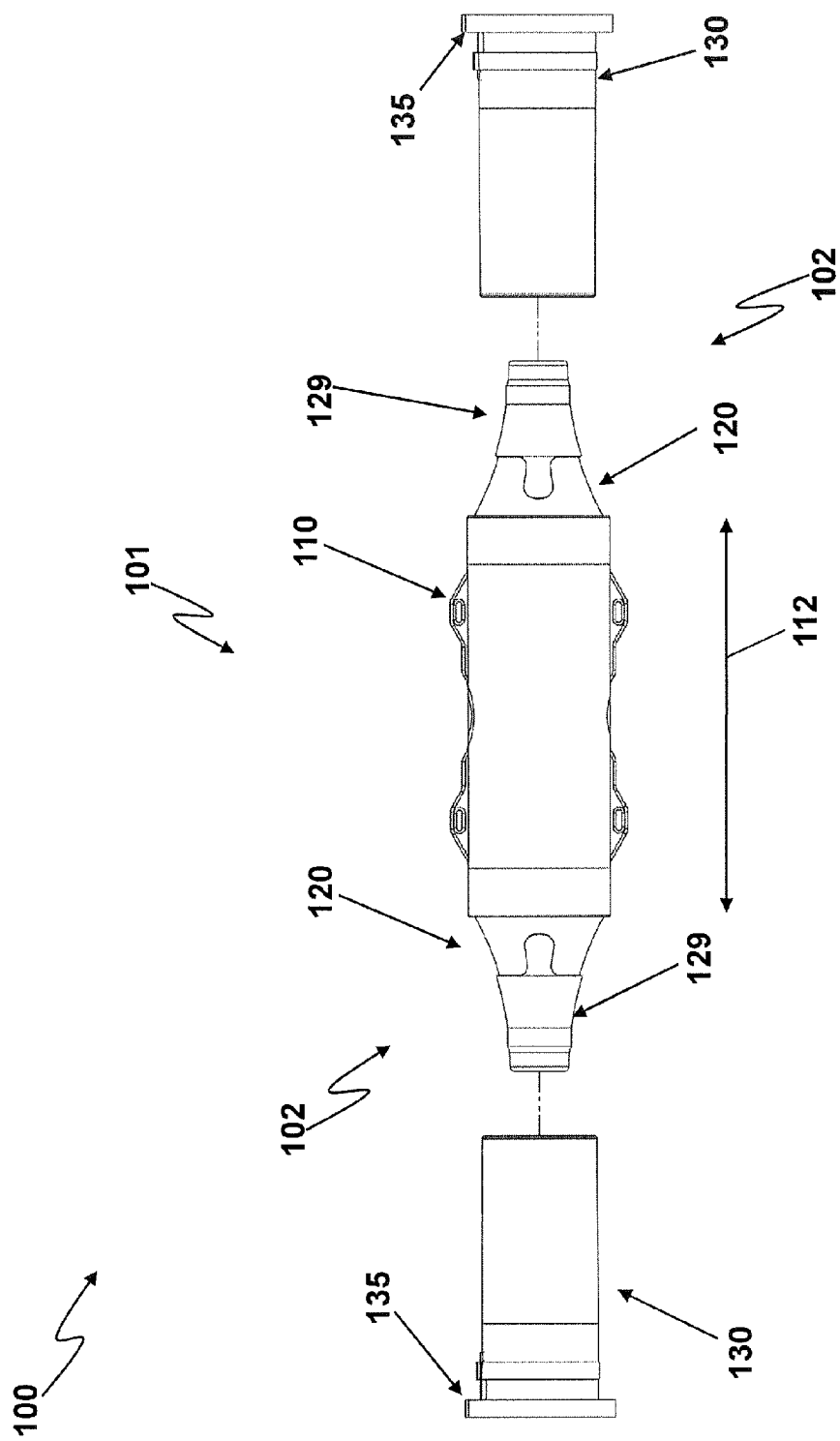
FIG. 3B is a side view of a completed splice housing in an unexpanded state in relation to solid support cores according to an embodiment of the invention.
Figure 3C:
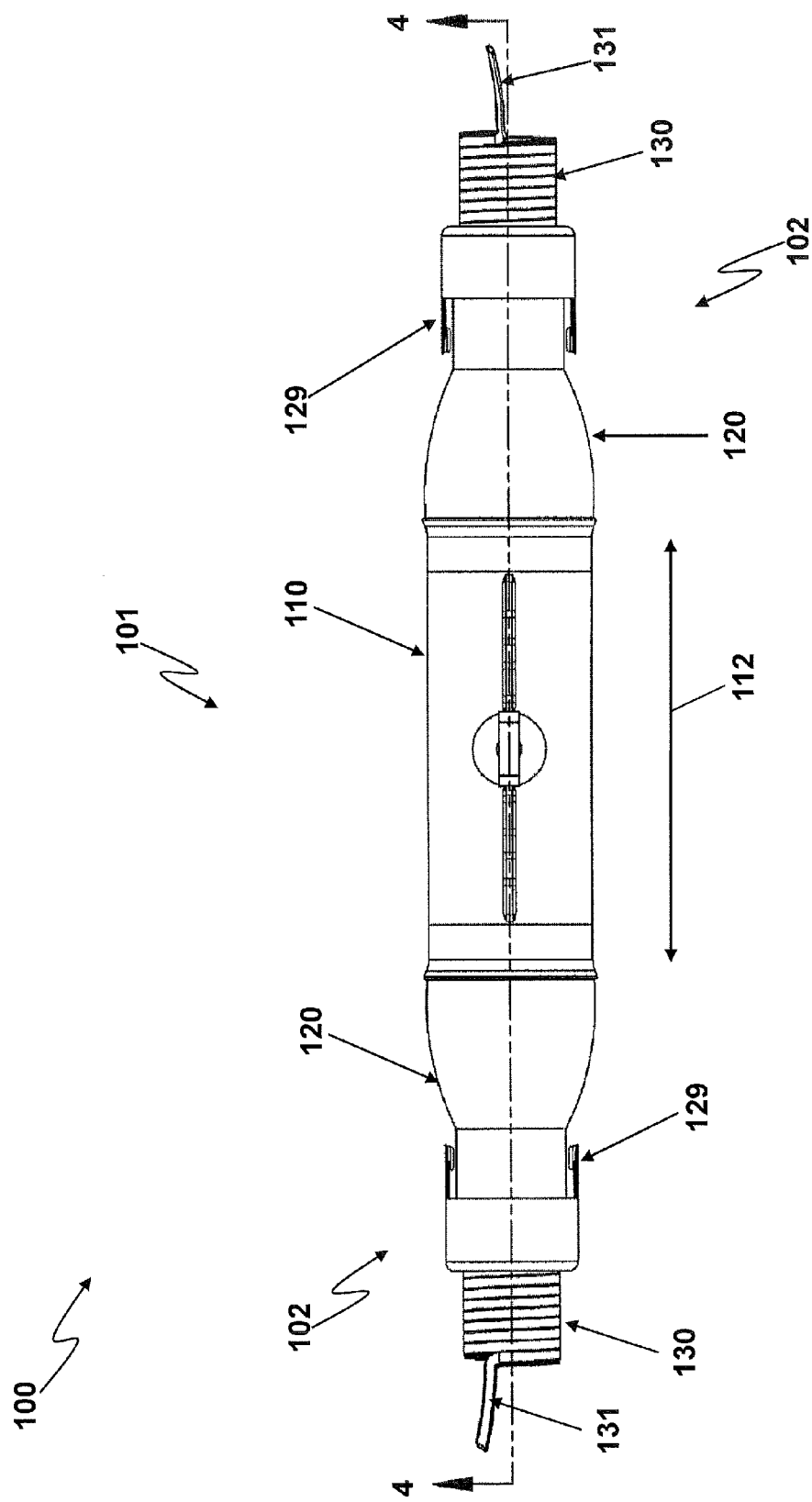
FIG. 3C is a side view of a completed splice housing in an expanded state stored on spiral support cores according to an embodiment of the invention.
Figure 4:
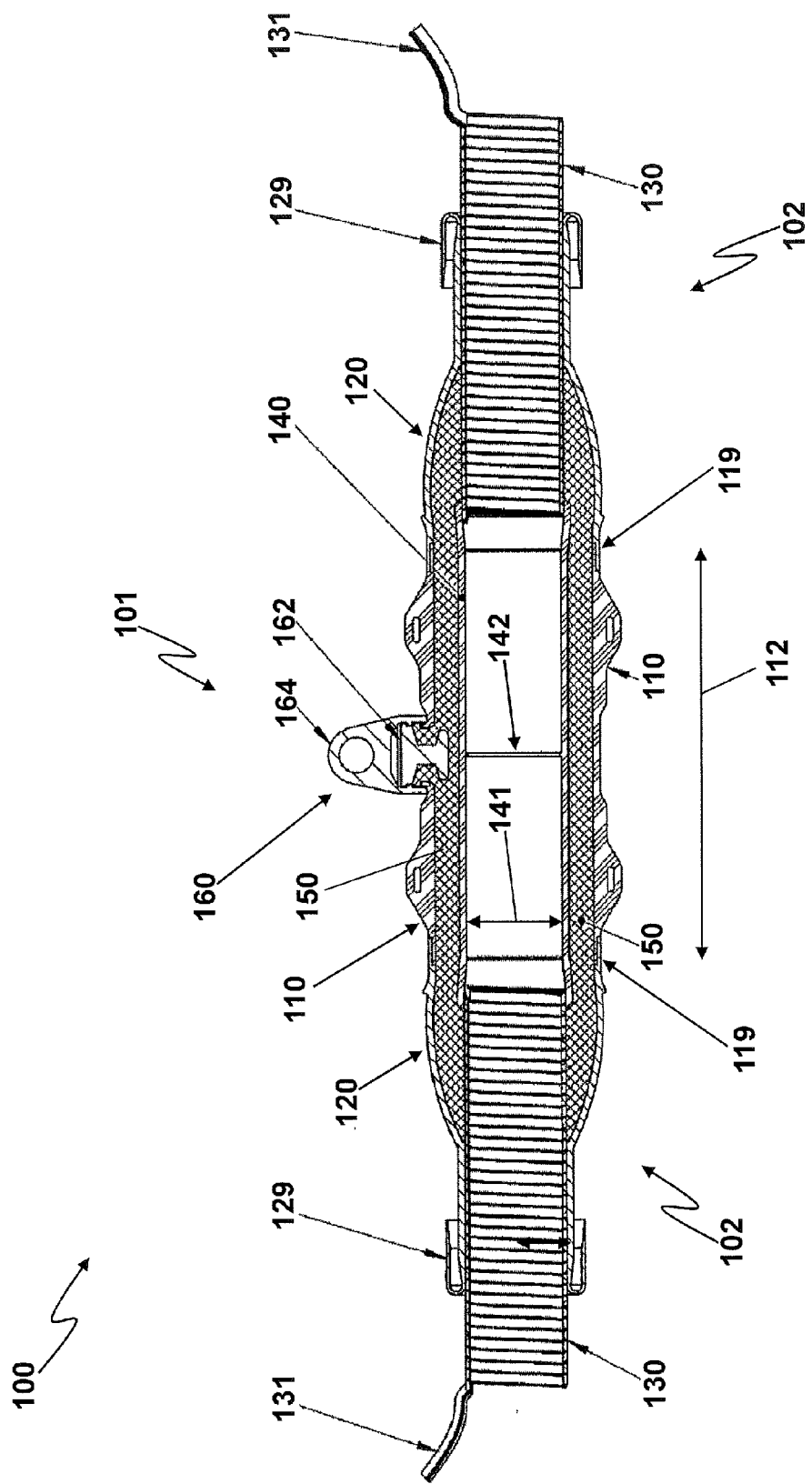
FIG. 4 is a cross-sectional view along a line 4-4 shown in FIG. 3C.

As illustrated in FIG. 3A, after molding the flaps 129 may be folded over. FIG. 3B shows the cores 130 in relation to, but not yet installed on, the molded joint 100. As shown in FIGS. 3C and 4, the ends sections 102 are mechanically expanded by any suitable means and then a respective core insert 130 is inserted into each end section 102. The core inserts 130 preferably each extend to the respective distal end of the insert 140 but extend only partially into the center section 101 itself; in preferred embodiments, the support cores 130 do not extend into the center section 101 at all but instead terminate within the lip of insert 140. With specific reference to spiral-type cores, as shown in FIG. 3C, it is desirable that the cores terminate at a location such that there is no hoop force on the end of the spiral core that might otherwise potentially initiate core collapse. This may not be an issue, however, with solid cores, as shown in FIGS. 3A and 3B, although expulsion of a solid core may be an issue if a sufficient force exists on the end of the core. The seal flaps 129 are also folded back upon themselves, with the support cores 130 extending distally past the folded seal flaps 129. The support cores 130 thus force the end sections 102 into an expanded state such that the internal diameters of the end sections 102 are substantially equal to the internal diameter 141 of the center section 101. This constitutes a stored state for the splice 100, prior to use in the field. Unlike the end sections 102, the size (internal diameter and external diameter) of the center section 101 remains substantially the same both immediately after being molded and while in the stored state; that is, the center section 101 preferably has a constant internal diameter 141 and external diameter and does not need to undergo significant mechanical expansion or contraction. Hence, its materials can be selected for the desired electrical, thermal or both properties. In contrast, the end sections 102, which undergo significant expansion and contraction due to the insertion and removal of the respective support cores 130, use materials that are selected for superior elasticity requirements, such as superior tension set properties. In preferred embodiments the splice housing should be capable of remaining on the support cores for up to two years. When the cores are removed the splice housing tends to recover to its original internal diameters. The fully recovered internal diameters after a two-year period of storage on the support cores should provide sufficient interference to the cable insulation to hold off all appropriate voltages (the ac voltage plus any potential overvoltage).

Figure 5A:
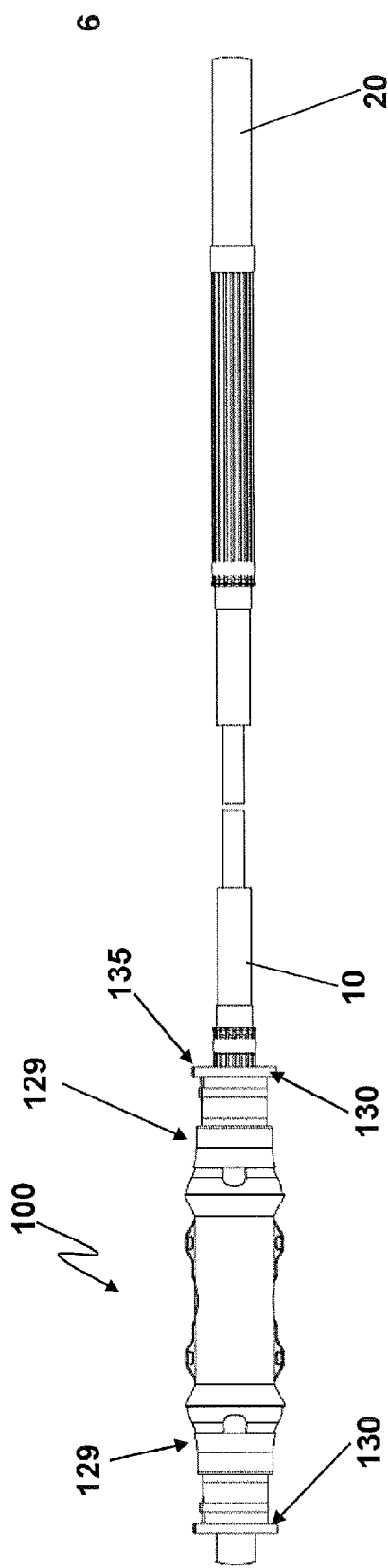
FIG. 5A is a side view of a splice housing stored on one cable prior to application of a metallic connector for the cable splicing.
Figure 5B:
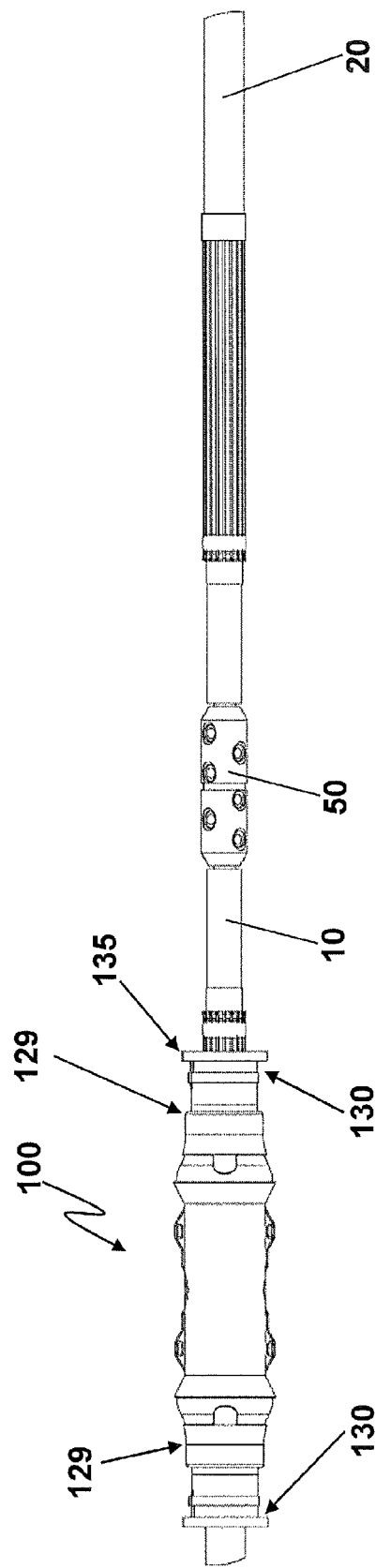
FIG. 5B is a side view of a splice housing stored on one cable after a metallic connector has been crimped onto the cables.
Figure 5C:
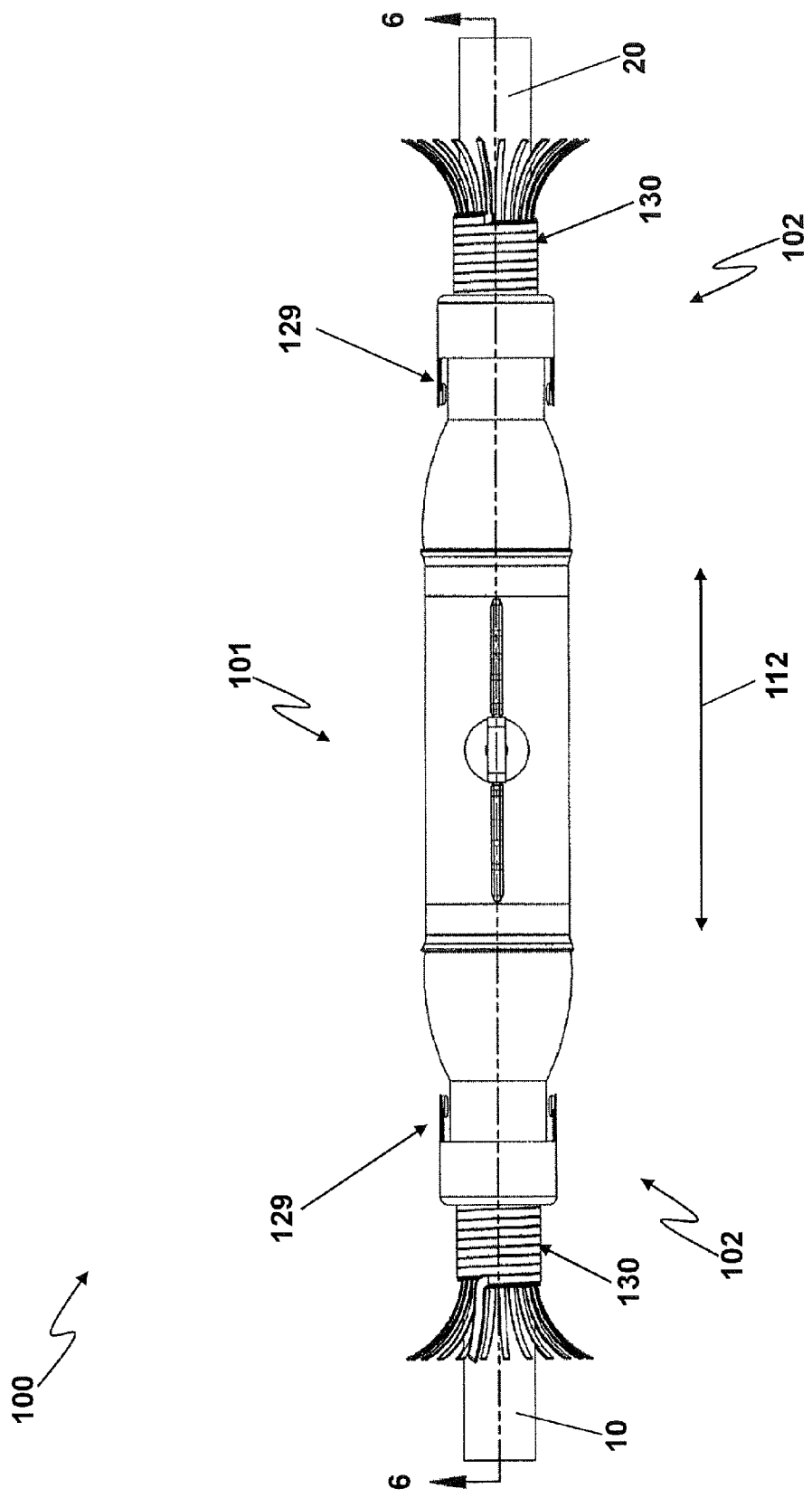
FIG. 5C is a side view of a splice housing centered over a crimped metallic connector according to an embodiment of the invention.
Figure 6:
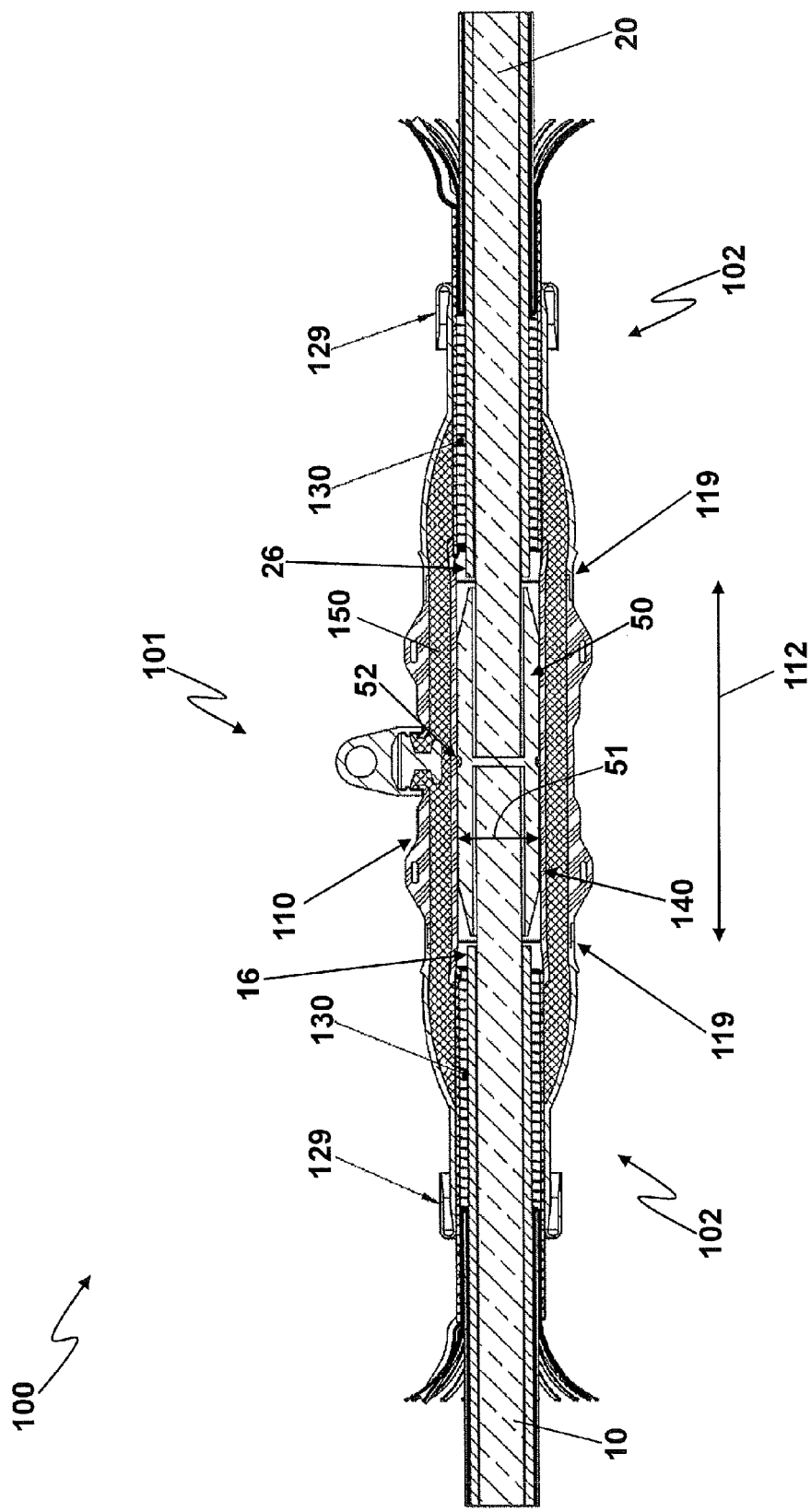
FIG. 6 is a cross-sectional view along a line 6-6 shown in FIG. 5C.

As illustrated in FIGS. 5 and 6, to use the embodiment splice housing 100, the cables 10, 20 are first prepared, with the splice housing 100 slid along one of two cables 10, 20 that are to be spliced together, as shown in FIG. 5A. This is easy to do, as in this state, the splice housing 100 has a nearly constant internal diameter along its entire length that is substantially the same as the internal diameter 141 of the center section 101, and which exceeds the external diameters of the cable conductors 10, 20. The metallic connector 50, which may be provided as a component separate from the splice housing 100 or as part of a kit that includes the splice housing 100, is used to crimp together the cable conductors 10, 20, as shown in FIG. 5B. Then, the splice housing 100 is slid back over the cable conductors 10, 20 until the center of insert 140 aligns with the center of the metallic connector 50, as shown in FIGS. 5C and 6. Because the internal diameter 141 of center section 101 is substantially equal to, or only slightly less than, the external diameter 51 of the connector 50, a snug, friction fitting between the connector 50 and the insert 140 is established that both thermally and electrically couples the connector 50 to the insert 140, and thus to the splice housing 100.

To facilitate central alignment of the insert 140 with the connector 50, the insert 140 may include a small bead, notch or the like 142 along its center region that engages with a corresponding notch, bead or the like 52 in the metallic connector 50, analogous to a snap-fit connection. Central alignment of the connector 50 with the insert 140 can thus be felt by the lineman during the installation process.

Figure 7:
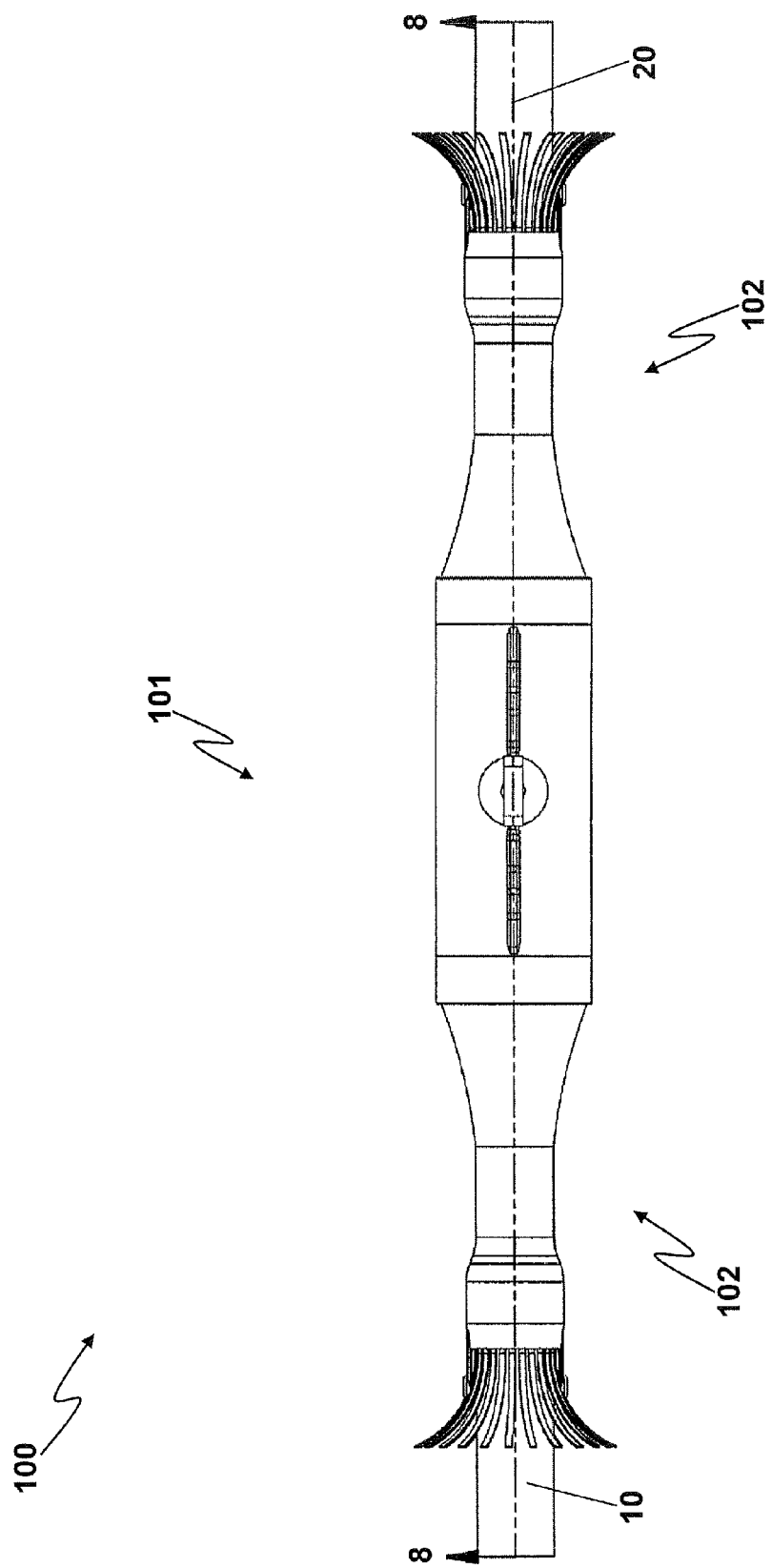
FIG. 7 is a side view of final joint assembly with an embodiment splice housing.

As shown in FIGS. 7 and 8, once the splice housing 100 is aligned over the connector 50, the lineman may remove each of the support cores 130 and then fold back the seal flaps 129 onto the cable conductors 10, 20. When the support cores 130 are removed, the end sections 102 constrict around respective cable conductors 10, 20 creating a secure friction fitting, as the molded minimum diameter 121 of the end sections 102 is significantly less than the external diameters of the cable conductors 10, 20. Optionally, where required, sealing mastic 60 is applied under and over the cable 10, 20 shielding wires 14, 24, and then the jacket seal flaps 129 are pulled up over the mastic 60 and cable jacket 12, 22. The seal flaps 129 preferably overlap any applied mastic 60 and the cable 10, 20 neutrals.

In some embodiments, when in the stored state the seal flaps 129 may not be folded over on top of themselves. In such embodiments, slightly longer support cores 130 may be needed to accommodate the increased length of the unfolded seal flaps 129.

Any suitable support core 130 may be used, such as solid-type cores, spiral cores or friable cores. As shown in FIGS. 3 and 4, a spiral-type core 130 may be used, in which an end 131 of the spiral core 130 extends distally from each end of the splice housing 100, and upon which the lineman may pull to unwind the spiral of the core and thus remove the core from within the end sections 102.

Figure 9A:
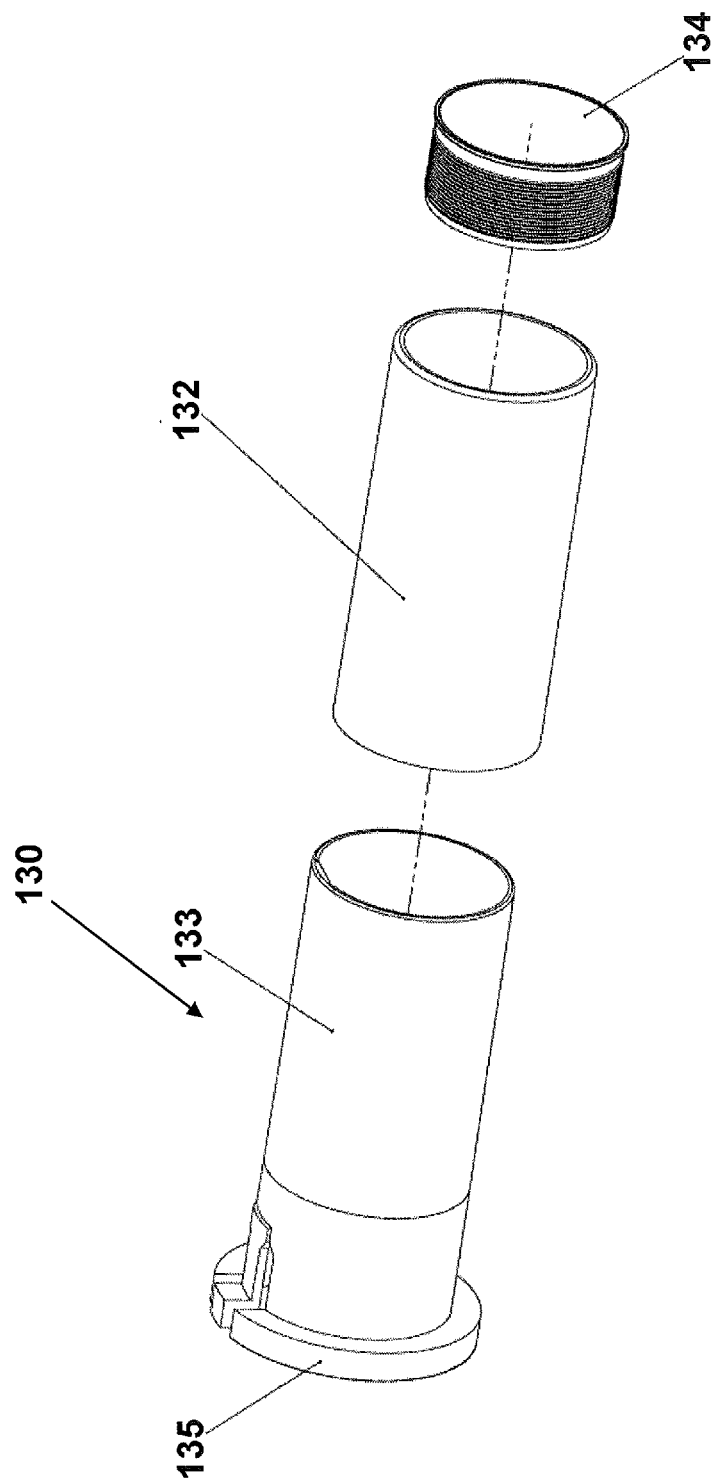
FIG. 9A is an exploded view of an embodiment solid support core and related components.
Figure 9B:
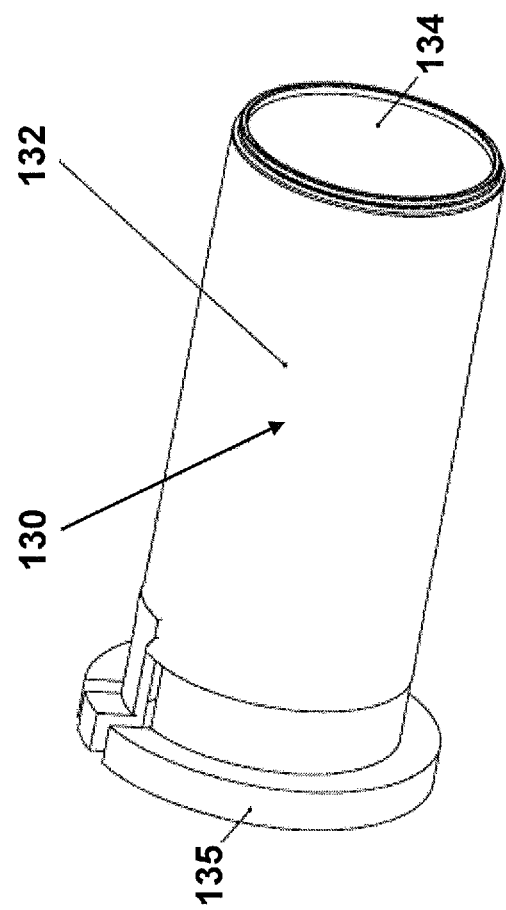
FIG. 9B is a perspective view of an embodiment solid support core and related components.

In other embodiments a solid core 130 may be used, as shown in FIGS. 9A and 9B. In such embodiments a film 132, such as Mylar, is attached by an adhesive to the support core 130 and doubled back on itself. This film 132 acts as a release layer to facilitate removal of the solid core 130 from its end section 102. In some embodiments, the release film 132 may be attached to the internal region of the end sections 102 by means of an adhesive. Adhesives may help to ensure that when the core 130 is pulled out of the splice housing 100, the release material 132 is pull out from under the recovering splice. The solid support core 130 may also have a textured finish on its outside surface 133 at least in the section which is directly supporting the splice exterior 120. The minor section of core 130 extending beyond the splice exterior 120 need not be textured. The coefficient of friction between the support core 130 and the release film 132 (and hence the force needed to remove the core) may be significantly less if the surface 133 of the support core 130 is roughened or textured. As there are no hoop forces on the portion of the support core 130 not supporting anything, there may be no need to texture the corresponding area, although texturing in also possible. However, if tape is used to fasten the release film 132 to the outside core surface 133 to prevent a premature core ejection, it may be easier to apply such tape to a non-textured surface. In some embodiments, the release film 132 may be attached to the internal region of the end sections 102 by a thin annular ring pressed 134 in place. The release film 132 may then folded back over the outside surface of the support core 130. In the preferred embodiment the support core 130 is equipped with an integral flange section 135 on the distal side of the splice housing. This flange 135 provides an easy section for a lineman to grip to remove the core 130 or can be used in conjunction with a core-removal tool if the lineman feels hand removal of the core is too difficult.

If a spiral support tube design is used, the amount of unwinding of the core material is reduced to a minimal amount. A solid core may be preferred, however, as a solid core provides a significantly faster and an ergonomic improvement over a spiral support tube design requiring significant unwinding of the core material. In contrast to the prior art that requires support cores along the entire length of the splice housing, the various embodiment designs limit the length of each support core section to a small amount which requires only minimal force to remove owing to the very short sections being used. Since the support cores are very short, the length of straight cable needed to remove the cores is drastically reduced. Further, as indicated earlier, as the center section 101 is not required to be expanded, it allows more flexibility in the rubber parameters for the conductive jacket 110 and conductive insert materials 140.

Moreover, because the center section 101 is not being expanded, various embodiments may include a capacitive test point structure 160 for circuit interrogation for energized or de-energized conditions. The test point structure 160 includes a capacitive test point 162 that extends down into the insulating material 150 towards the insert 140, but does not touch the insert 140, and out beyond the rubber exterior 110. For example, a minimum distance between the capacitive test point 162 and the insert 140 may be 0.125 inches. It will be appreciated, however, that the spacing may depend on the allowable electrical stress, the dielectric strength of the insulating material, the voltage class of the splice and the manufacturers' allowable limits; for example, a spacing of 0.250" to 0.375" may be suitable for 15 to 35 kV class splices. An electrically insulative cap 164 may be supplied to cover the test point 162 protruding beyond exterior 110 to maintain the test point 162 at or near ground potential. Any suitable means may be used to mechanically couple the cap 164 into position, such as a snap-fit engagement, a threaded engagement or the like with the test point 162, rubber exterior 110 or both.

Those skilled in the art will recognize that the present invention has many applications, may be implemented in various manners and, as such is not to be limited by the foregoing embodiments and examples. Any number of the features of the different embodiments described herein may be combined into one single embodiment, the locations of particular elements can be altered and alternate embodiments having fewer than or more than all of the features herein described are possible. Functionality may also be, in whole or in part, distributed among multiple components, in manners now known or to become known.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention. While there had been shown and described fundamental features of the invention as applied to being exemplary embodiments thereof, it will be understood that omissions and substitutions and changes in the form and details of the disclosed invention may be made by those skilled in the art without departing from the spirit of the invention. Moreover, the scope of the present invention covers conventionally known, future developed variations and modifications to the components described herein as would be understood by those skilled in the art.

What is claimed is:

1. A splice housing comprising:
   a first end constructed and arranged to engage a first cable;
   a second end constructed and arranged to engage a second cable;
   a central portion disposed between the first and second ends and constructed to engage a connector that mechanically couples the first cable to the second cable;
   a first support core to hold the first end in an expanded state; and
   a second support core to hold the second end in an expanded state;
   wherein the first end and the second end are formed to have relaxed internal diameters that are smaller than an internal diameter of the central portion;
   wherein the first end and the second end each comprise a seal flap configured to respectively form a seal over the first cable and the second cable, each seal flap foldable back upon itself; and
   the connector comprises a notch or protrusion configured to engage with a corresponding protrusion or notch in the central portion.

2. The splice housing of claim 1 wherein the internal diameter of the central portion is defined by an insert, the insert configured to mechanically and thermally engage with the connector.

3. The splice housing of claim 2 wherein an insulating material is disposed between the insert and an exterior of the central portion.

4. The splice housing of claim 3 wherein exteriors of the first and second ends are formed from materials that are different from a material used to form the exterior of the central portion.

5. The splice housing of claim 3 further comprising a test point structure disposed in the central portion to test an electrical state of the connector, the first cable or the second cable.

6. The splice housing of claim 1 wherein a relaxed internal diameter of each seal flap is greater than the corresponding relaxed internal diameters of the first and second ends.

7. The splice housing of claim 2 wherein ends of the insert extend partially into the first end and the second end.

8. The splice housing of claim 1 wherein a release material is disposed between each support core and the first and second ends.

9. The splice housing of claim 1 wherein an exterior of the central portion is made from a material that is different from respective materials used for exteriors of the first end and the second end.

10. The splice housing of claim 1 further comprising a sealing material disposed between the seal flaps and the corresponding first cable and second cable.

11. A splice housing comprising:
    a first end constructed and arranged to engage a first cable;
    a second end constructed and arranged to engage a second cable;
    a central portion disposed between the first and second ends and having an internal diameter defined by an insert, the insert configured to mechanically and thermally engage a connector that mechanically couples the first cable to the second cable;
    an insulating material disposed between the insert and an exterior of the central portion;
    a first support core to hold the first end in an expanded state;

a second support core to hold the second end in an expanded state; and a test point structure disposed in the central portion to test an electrical state of the first or second cables, the test point structure comprising a test point disposed within the insulating material and extending out of the exterior of the central portion;

wherein the first end and the second end are formed to have relaxed internal diameters that are smaller than the internal diameter of the central portion.

12. The splice housing of claim 11 wherein exteriors of the first and second ends are formed from materials that are different from the material used to form the exterior of the central portion.

13. The splice housing of claim 12 wherein ends of the insert extend partially into the first end and the second end.

14. The splice housing of claim 11 wherein the first end and the second end each comprise a seal flap folded foldable back upon itself.

15. The splice housing of claim 14 wherein a relaxed internal diameter of each seal flap is greater than the corresponding relaxed internal diameters of the first and second ends.

16. The splice housing of claim 11 wherein the metallic connector comprises a notch or protrusion configured to engage with a corresponding protrusion or notch in the central portion.

17. The splice housing of claim 11 wherein a release material is disposed between each support core and the first and second ends.

18. The splice housing of claim 11 wherein an exterior of the central portion is made from a material that is different from respective materials used for exteriors of the first end and the second end.

19. The splice housing of claim 14 further comprising a sealing material disposed between the seal flaps and the corresponding first cable and second cable.

20. A splice housing comprising:
a first end constructed and arranged to engage a first cable;
a second end constructed and arranged to engage a second cable;
a central portion disposed between the first and second ends and constructed to engage a connector that mechanically couples the first cable to the second cable;
a first support core to hold the first end in an expanded state; and
a second support core to hold the second end in an expanded state;
wherein the first end and the second end are formed to have relaxed internal diameters that are smaller than an internal diameter of the central portion;
wherein the internal diameter of the central portion is defined by an insert, the insert configured to mechanically and thermally engage with the connector, ends of the insert extending at least partially into the first end and the second end.

21. The splice housing of claim 20 wherein the first end and the second end each comprise a seal flap foldable back upon itself.

22. The splice housing of claim 20 wherein an insulating material is disposed between the insert and an exterior of the central portion.

23. The splice housing of claim 22 wherein exteriors of the first and second ends are formed from materials that are different from the material used to form the exterior of the central portion.

24. The splice housing of claim 22 further comprising a test point structure disposed in the central portion to test an electrical state of the connector, the first cable or the second cable.

25. The splice housing of claim 24 wherein the test point structure comprises a test point disposed within the insulating material and extending out of the exterior of the central portion.

26. The splice housing of claim 20 wherein a release material is disposed between each support core and the first and second ends.

27. The splice housing of claim 20 wherein the metallic connector comprises a notch or protrusion configured to engage with a corresponding protrusion or notch in the central portion.

28. The splice housing of claim 21 wherein a relaxed internal diameter of each seal flap is greater than the corresponding relaxed internal diameters of the first and second ends.

29. The splice housing of claim 20 wherein an exterior of the central portion is made from a material that is different from respective materials used for exteriors of the first end and the second end.

30. The splice housing of claim 21 further comprising a sealing material disposed between the seal flaps and the corresponding first cable and second cable.

31. A splice housing comprising:
a first end constructed and arranged to engage a first cable;
a second end constructed and arranged to engage a second cable;
a central portion disposed between the first and second ends and constructed to engage a connector that mechanically couples the first cable to the second cable;
a first support core to hold the first end in an expanded state; and
a second support core to hold the second end in an expanded state;
wherein the first end and the second end are formed to have relaxed internal diameters that are smaller than an internal diameter of the central portion;
wherein a release material is disposed between each support core and the first and second ends.

32. The splice housing of claim 31 wherein the internal diameter of the central portion is defined by an insert, the insert configured to mechanically and thermally engage with the connector.

33. The splice housing of claim 32 wherein an insulating material is disposed between the insert and an exterior of the central portion.

34. The splice housing of claim 33 wherein exteriors of the first and second ends are formed from materials that are different from a material used to form the exterior of the central portion.

35. The splice housing of claim 33 further comprising a test point structure disposed in the central portion to test an electrical state of the connector, the first cable or the second cable.

36. The splice housing of claim 35 wherein the test point structure comprises a test point disposed within the insulating material and extending out of the exterior of the central portion.

37. The splice housing of claim 32 wherein ends of the insert extend partially into the first end and the second end.

38. The splice housing of claim 31 wherein the first end and the second end each comprise a seal flap foldable back upon itself.

39. The splice housing of claim 38 wherein a relaxed internal diameter of each seal flap is greater than the corresponding relaxed internal diameters of the first and second ends.

40. The splice housing of claim 31 wherein the connector comprises a notch or protrusion configured to engage with a corresponding protrusion or notch in the central portion.

41. The splice housing of claim 31 wherein an exterior of the central portion is made from a material that is different from respective materials used for exteriors of the first end and the second end.

42. The splice housing of claim 38 further comprising a sealing material disposed between the seal flaps and the corresponding first cable and second cable.

43. A method for attaching a first cable to a second cable, the method comprising:
- using a connector to mechanically and electrically couple the first cable to the second cable;
- sliding a splice housing over the connector so that an insert within a central portion of the splice housing contacts the connector;
- removing a first support core from a first end of the splice housing so that the first end of the splice housing constricts onto the first cable; and
- removing a second support core from a second end of the splice housing so that the second end of the splice housing constricts onto the second cable;
- wherein an internal diameter of the central portion is defined by the insert, the insert configured to mechanically and thermally engage with the connector, ends of the insert extending at least partially into the first end and the second end.

44. The method of claim 43 further comprising:
- applying a sealing material to the first cable and to the second cable;
- unfolding a first seal flap folded over on the first end of the splice housing onto the first cable, the first seal flap engaging with the sealing material; and
- unfolding a second seal flap folded on the second end of the splice housing onto the second cable, the second seal flap engaging with the sealing material.

45. The method of claim 43 further comprising utilizing a test point structure in the central portion of the splice housing to test an electrical state of the first cable, the second cable or a splice between the first and second cables.

* * * * *